United States Patent [19]

Cumbo

[11] Patent Number: 5,171,607
[45] Date of Patent: Dec. 15, 1992

[54] METHOD OF DEPOSITING DIAMOND-LIKE CARBON FILM ONTO A SUBSTRATE HAVING A LOW MELTING TEMPERATURE

[75] Inventor: Michael J. Cumbo, Rochester, N.Y.

[73] Assignee: Bausch & Lomb Incorporated, Rochester, N.Y.

[21] Appl. No.: 471,849

[22] Filed: Jan. 29, 1990

[51] Int. Cl.⁵ .................. B05D 3/06; C01B 31/06; C23C 14/00
[52] U.S. Cl. .................... 427/570; 427/577; 204/192.35; 423/446
[58] Field of Search .............. 427/38, 39, 42, 45.1, 427/40, 9, 10; 423/446, 448, 449; 204/192.13, 192.15, 192.16, 192.26, 192.3, 192.31, 192.33, 192.35

[56] References Cited

U.S. PATENT DOCUMENTS

| | | | |
|---|---|---|---|
| 4,504,519 | 3/1985 | Zelez | 427/39 |
| 4,645,977 | 2/1987 | Kurokawa | 118/50.1 |
| 4,961,958 | 10/1990 | Desphandey et al. | 427/39 |

FOREIGN PATENT DOCUMENTS

| | | |
|---|---|---|
| 0267679 | 5/1988 | European Pat. Off. |
| 60-4901 | 1/1985 | Japan |
| 63-225556 | 9/1988 | Japan |
| 64-1588 | 1/1989 | Japan |
| 64-2001 | 1/1989 | Japan |
| 1-59652 | 3/1989 | Japan |
| 1-148791 | 6/1989 | Japan |
| 1-221291 | 9/1989 | Japan |
| 62-227763 | 10/1989 | Japan |
| 1-298093 | 12/1989 | Japan |

OTHER PUBLICATIONS

"Metallization of Polytetrafluoroethylene Substrats by Ion Plating" A. Celerier and J. Machet, *Thin Solid Films*, 148, Apr. 27, 1987, pp. 323-332, Lausanne, Switzerland.

Primary Examiner—Shrive Beck
Assistant Examiner—Marianne L. Padgett

[57] ABSTRACT

A diamond-like carbon film is deposited on an insulating substrate using a solid carbon source evaporated by an electron beam so as to maintain the substrate temperature below about 150° C. in a differentially evacuated chamber containing a selective etchant gas such as hydrogen. In orer to bombard the substrate with positively charged ions while preventing accumulation of a repulsive surface charge, a radio frequency (RF) electric field is applied to a rotating fixture holding the substrate. The differentially evacuated chamber maintains the atmospheric pressure around the solid carbon source at one end of the chamber at a sufficiently low pressure to prevent loss of electron beam energy and thereby enable vaporization of the carbon while maintaining the substrate at the other end of the chamber at a higher pressure which enables the RF electric field to excite an ion gas plasma around the substrate and thereby facilitate deposition of the diamond-like carbon film. In the preferred embodiment, the differentially evacuated chamber has a bypass manifold connected between the two ends of the chamber. A control system responding to pressure sensing apparatus inside the chamber governs the position of a butterfly valve in the bypass manifold to regulate the differential pressure in the chamber. In order to keep the substrate temperature below about 150°, the rotating fixture holding the substrate is water-cooled.

14 Claims, 1 Drawing Sheet

METHOD OF DEPOSITING DIAMOND-LIKE CARBON FILM ONTO A SUBSTRATE HAVING A LOW MELTING TEMPERATURE

BACKGROUND OF THE INVENTION

1. Technical Field

The invention is related to processes for vacuum deposition of thin diamond-like carbon films on a substrate having a relatively low melting temperature such as plastic lenses.

2. Background Art

Optical lenses used in eye wear for protecting the eye from bright light fall into one of two categories. The first category includes plastic lenses such as those comprising polycarbonate or CR39 (allyl di-glycol carbonate). The advantages of this type of lens are that it is relatively light weight and does not tend to shatter under hard impact. A secondary advantage is that a polarizing material such as poly-vinyl alcohol may be readily integrated on the plastic material to enable the lens to prevent annoying reflected glare from reaching the eye. A severe disadvantage is that the plastic material is relatively soft and therefore is easily scratched, disfigured or otherwise rendered useless as an optical lens. Moreover, such plastic materials are not practically susceptible of being hardened by known processes, such as deposition of diamond-like carbon films. This is because such processes are typically carried out at high temperatures, raising the temperature of the substrate above its melting point.

A second category includes glass lenses, which enjoy the distinct advantage of being very hard and therefore virtually impervious to scratching under normal use. While the lenses made from such materials are therefore more durable and longer-lasting, they suffer from several significant disadvantages. First, glass lenses are very heavy, thus making eye-wear in which they are used less comfortable. Secondly, glass lenses tend to shatter in response to a sufficiently hard impact and they cost more than plastic lenses. Another disadvantage is that there is no practical method for providing polarizing material on a glass lens.

Accordingly there is a great need in the art for a lens which enjoys the advantages of a plastic lens as well as the advantages of a glass lens without suffering from the disadvantages of either. Such a need could be met if a way could be found to deposit a diamond-like carbon film on a plastic lens or on a lens having a plastic coating or surface. Unfortunately, there is no practical method known for depositing diamond-like carbon on such substrates.

Various processes for depositing diamond-like carbon on a substrate are known. However, none of them are disclosed as being useful with substrates such as plastic which melt at temperatures between 80° C. and 150° C. It is believed that in many cases such processes raise the substrate temperature well beyond 150° C. and therefore cannot be used to deposit diamond-like carbon on a plastic substrate. However, as will be described later in this specification, the present invention employs relatively low temperatures of less than about 150° C., preferably less than 100° C. and most preferably less than about 80° C., thereby allowing deposition of diamond-like carbon on substrates having lower melting temperatures.

U.S. Pat. No. 3,961,103 to Aisenberg discloses a process for depositing a diamond-like carbon film on a substrate with a glow discharge carbon ion source and an RF electric field to attractively bias the surface of the substrate while avoiding the build-up of a repulsive charge around the substrate in the presence of hydrogen gas. Aisenberg further discloses that the glow discharge carbon ion source and the substrate are held in separate evacuated chambers, the carbon ions reaching the substrate through a special constrictor electrode connecting the two chambers, the constrictor electrode having a particular arrangement with an extractor anode inside the chamber housing the substrate. This process suffers from the disadvantage of requiring two separate chambers with special electrodes to attract the carbon ions from one chamber to the other. A similar process is disclosed in Aisenberg et al. "Ion-Beam Deposition of Thin Films of Diamondlike Carbon," *Journal of Applied Physics*, Vol. 42, No. 7, pp. 2953-2958 (June 1971).

U.S. Pat. No. Re. 32,464 to Aine, discloses a process for depositing on a heated substrate a carbon film of a different type, namely graphite carbon from a carbon ion source. The carbon ions are generated by RF induced plasma sputtering of a carbon target electrode with argon ions from a glow discharge.

German Offenlegungsschrift 2,736,514 discloses a process for depositing a carbon film on a glass substrate using a gaseous hydrocarbon source to produce carbon ions. An RF field on the substrate attracts the carbon ions to the substrate.

Banks et al., "Ion Beam Sputter-Deposited Diamondlike Films," *Journal of Vacuum Science Technology*, Vol. 21, pp. 807-814 (September/October 1982) discloses a process for depositing diamond-like carbon films on a substrate by sputtering carbon from a graphite target onto the substrate while bombarding the substrate itself with argon ions. The process is directed to substrates such as silica, copper and tantalum which can endure relatively high temperatures.

U.S. Pat. No. 4,490,229 to Mertich et al. discloses a process for depositing diamond-like carbon films onto a substrate by an ion beam containing argon ions and a hydrocarbon gas such as methane while a second argon ion beam bombards the substrate which removes the lesser bound carbon atoms from the substrate.

U.S. Pat. No. 4,725,345 to Sakamoto et al. discloses a process for depositing a diamond-like carbon film onto an acoustic diaphram substrate by vaporizing carbon from a solid carbon source using an electron beam. This process suffers from the disadvantage that a D.C. (constant) field is applied to the substrate to attract the vaporized carbon, so that a repulsive surface charge accumulates on the non-conductive substrates. Therefore, the process is not suitable for use with insulating substrates such as plastic. More importantly, this process also suffers from the disadvantage that the electron beam vaporization of the solid carbon target requires a lower ambient pressure while the carbon deposition on the substrate requires a higher ambient pressure. The electron beam vaporization step must be carried out at a low ambient pressure of about $10^{-4}$ torr because at higher pressures the electron beam source is unstable due to discharge or breakdown ionization of the surrounding gas. This in turn causes the trajectory of the electron beam to be unstable. The carbon vaporization step must be carried out at a higher pressure of around $10^{-2}$ or $10^{-3}$ torr because at lower pressures there are not enough collisions between atoms and molecules in the gas atmosphere surrounding the substrate for the applied electric field to excite a plasma around the substrate. Thus, the vaporization and deposition steps appear to be incompatible for carrying out in the same vacuum chamber.

In summary, none of the foregoing processes appear to be useful for depositing diamond-like carbon films on substrates having low melting temperatures such as plastic lenses. Some of the processes involve ion beam bombardment or glow discharging which may increase the substrate temperature above the melting point of the substrate. Another process involving electron beam vaporization of a solid carbon source is problematic because its vaporization and deposition steps should be carried out at different pressures and are therefore incompatible for use in the same vacuum chamber.

DISCLOSURE OF THE INVENTION

In the invention, a diamond-like carbon film is deposited on the surface of a substrate such as a plastic lens in order to render the substrate surface hard and scratch-resistant while maintaining the substrate's temperature below its melting point. The invention employs relatively low temperatures of less than about 150° C., preferably less than 100° C. and most preferably less than about 80° C., thereby allowing deposition of diamond-like carbon on substrates having lower melting temperatures. The carbon is first vaporized by directing an electron beam at a solid carbon source in a vacuum chamber containing the substrate. An applied electric field around the substrate ionizes the hydrogen to facilitate diamond-like carbon deposition on the substrate and selective etching from the substrate of non-diamond-like carbon by the hydrogen gas. The advantage of using electron beam vaporization of solid carbon is that the diamond-like carbon deposition occurs at ambient temperatures which do not cause the substrate temperature to be raised to its melting point. One problem using electron beam vaporization of solid carbon for this purpose is that both the substrate and the carbon film are electrically non-conductive materials, so that repulsive charge accumulated during deposition of carbon on the substrate surface will build up until it prevents further ion bombardment of the substrate. In order to solve this problem, the applied electric field is generated by capacitively coupling a radio frequency (RF) voltage to a rotating fixture holding the substrate. The RF voltage creates an RF field which ionizes the atmosphere around the substrate. The advantage of the RF field is that, unlike a constant field, the RF field avoids the accumulation of a repulsive charge around the substrate which would inhibit the deposition of diamond-like carbon.

The invention employs a differentially evacuated chamber which maintains the atmospheric pressure around the solid carbon source on one side of the chamber at a suitably low pressure to permit stable operation of the electron beam source and stable trajectory of the electron beam while maintaining the substrate on the opposite side of the chamber at a higher pressure suitable for maintaining a plasma of ionized gas around the substrate. The two sides of the chamber are separated by a baffle having a 1.5 inch opening through which the vaporized carbon flows from the source to the substrate. In the preferred embodiment, the differentially evacuated chamber has a bypass manifold connecting the two sides of the chamber. A control system responding to a pressure sensor inside the chamber governs the position of a butterfly valve in the bypass manifold to regulate the differential pressure across the baffle. In order to assure that the substrate temperature is maintained below 100°, the rotating fixture holding the substrate is water-cooled. A quartz crystal monitor senses the amount of vaporized carbon reaching the substrate. A controller sensing the output of the quartz crystal monitor regulates the rate at which the electron beam vaporizes the solid carbon source in order to maintain the rate at which carbon is deposited on the substrate at a predetermined level.

The diamond-like carbon film exhibits many of the desirable physical properties of naturally occurring diamond which make the film particularly useful as a protective coating on optical components or eye wear. These properties include excellent mechanical hardness, chemical durability and low optical absorption over a wide spectral range. The combination of substrates having low melting temperatures such as plastic and the diamond-like carbon film makes possible lightweight scratch-resistant lenses, thus fulfilling a longstanding need in the art.

BRIEF DESCRIPTION OF THE DRAWING

The preferred embodiment of the invention is described in detail below by reference to the accompanying drawing of FIG. 1, which is a diagram of apparatus including a differentially evacuated chamber for carrying out the invention.

MODES FOR CARRYING OUT THE INVENTION

Figure 1:
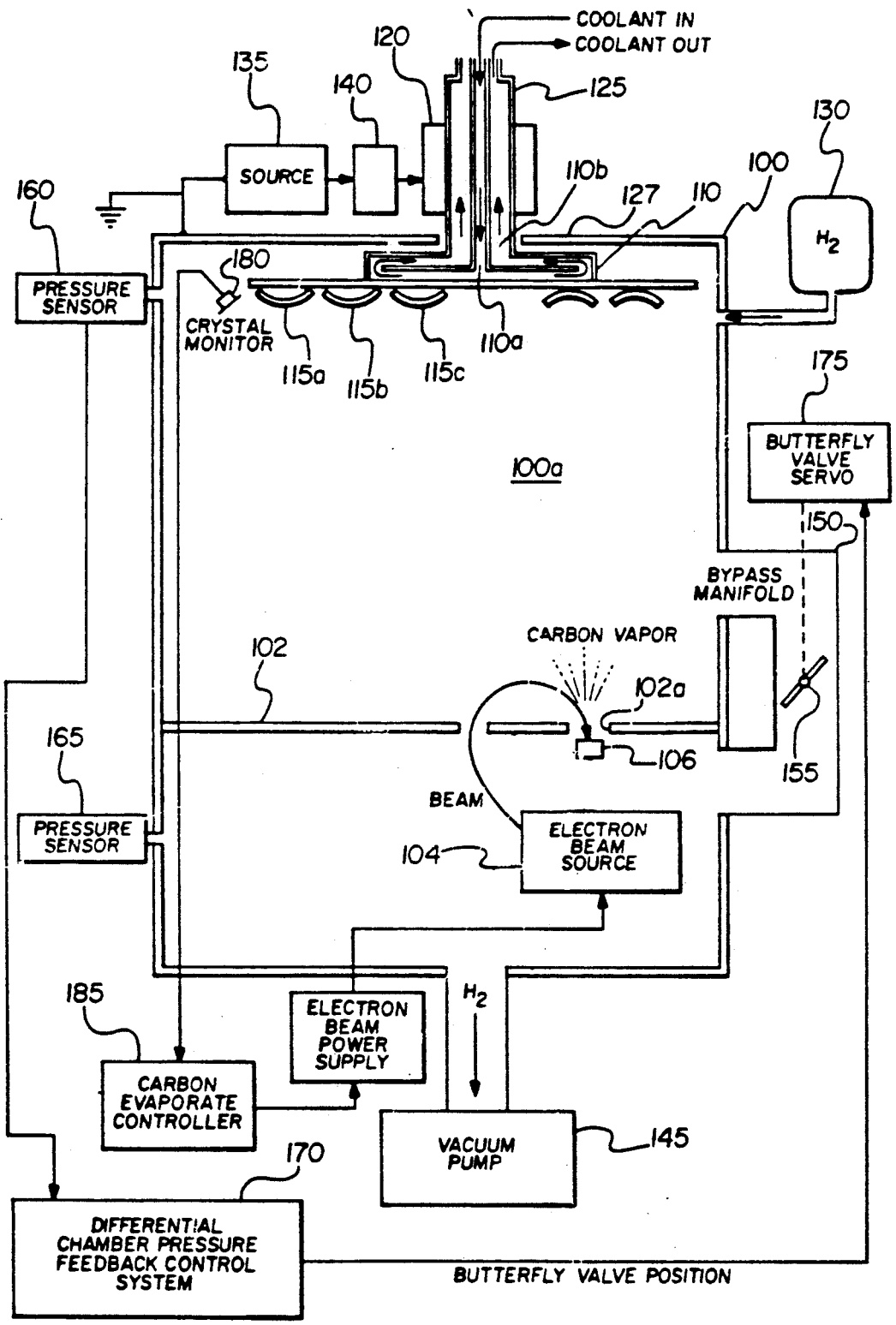

Referring now to FIG. 1, a sealed vacuum chamber 100 is divided into two sides 100a and 100b by a baffle 102 having an opening 102a of about 1.5" in diameter permitting vapor flow between the two sides 100a, 100b of the chamber 100. An electron beam source 104 directs an electron beam at a solid carbon target 106 in the second side 100b of the chamber 100 near the opening 102. The solid carbon target 106 is preferably graphite. While the carbon target 106 and the electron beam source 104 are separated in FIG. 1 for the sake of clarity, it should be understood that actually they are in physical contact in accordance with standard practise. A rotating electrically conductive fixture 110 in the first side 100a of the chamber 100 holds substrates 115a, 115b, 115c, etc. on which diamond-like carbon film is to be deposited. The substrates 115 may, for example, be plastic lenses. A rotating drive assembly 120 turns a rotating shaft 125 extending through the wall 127 of the chamber 100 to rotate the fixture 110. A hydrogen gas supply 130 furnishes hydrogen gas to the interior of the chamber 100. In order to ionize the hydrogen gas around the substrates 115, an RF power source 135 applies a high frequency voltage through a capacitive tuning network 140 to the drive shaft 125 which is thereby coupled to the conductive fixture 110. The alternating nature of the field thereby produced in the chamber 100 prevents the build-up of a repulsive surface charge on the substrates 115 during diamond-like carbon formation. At the same time the field maintains a plasma around the substrates 115 and attracts the hydrogen ions and electrons to the substrates during alternate half cycles of the sine wave. Preferably, the frequency of the RF source 135 is around 13.56 MHz while its power density is sufficient to ionize the atmosphere around the substrates 115. This power density as measured at the capacitive tuning network 140 is in excess of 0.1 watts/cm$^2$ and preferably lies the range between 0.2 watts/cm$^2$ and 1.0 watts/cm$^2$. The ionized hydrogen gas enhances the formation of diamond-like carbon (hybrid sp$^3$ carbon) on the substrates 115 by acting as a selective etchant. The hydrogen chemically combines with any non-diamond-like carbon or graphite (hybrid sp$^2$ carbon) on a substrate surface to form methane gas which is pumped away. Preferably, the hydrogen gas is mixed with a small amount of argon in the ratio of 50:1.

The carbon deposition on the substrates 115 should be carried out at an ambient pressure of at least around $10^{-2}$ or $10^{-3}$ torr in order for the applied electric field to maintain a plasma of ionized vapor near the substrate, while the carbon vaporization of the graphite source 106 should be carried out at an ambient pressure of no greater than about $10^{-4}$ torr in order to permit stable operation of the electron beam source 104. In order to accomplish this, the chamber 100 is differentially evacuated across the baffle 102. The ambient pressure in the vicinity of the substrates 115 in the first side 100a of the chamber 100 is maintained at the higher pressure (around $10^{-2}$ to $10^{-3}$ torr) The ambient pressure in the vicinity of the electron beam path between the electron beam source 104 and the solid carbon target 106 in the second side 100b of the chamber 100 is maintained at or below the lower pressure (around $10^{-4}$ torr). A vacuum pump 145 evacuates the second chamber side 100b to about $10^{-4}$ torr. The pressure difference across the baffle 102 is controlled through a bypass manifold 150 by a butterfly valve 155. The bypass manifold 150 has a diameter of about three inches. A first pressure sensor 160 senses the ambient pressure in the first side 100a of the chamber 100 near the substrates 115 while a second pressure sensor 165 allows the user to inspect the ambient pressure in the second side 100b of the chamber 100. The vacuum pump 145 is selected so as to maintain this pressure at or below $10^{-4}$ torr. A differential chamber pressure feedback control system 170 responds to the output of the first pressure sensor 160 to control the position of the butterfly valve 155 through a butterfly valve servo 175 in order to regulate the ambient pressure near the substrates 115 in the first side 100a of the chamber 100. The resonant frequency of a quartz crystal monitor 180 near the substrate fixture 110 changes as vaporized carbon accumulates on its surface. The rate at which carbon accumulates on the quartz crystal monitor 180 is proportional to the rate at which carbon is deposited on the nearby substrates 115. A controller 185 regulates the rate at which carbon is vaporized from the graphite source 106 by sensing the change in the resonant frequency of the quartz crystal monitor and adjusting the filament current in the electron beam source 104 so as to achieve the requisite carbon deposition rate on the substrates 115. Typically, the controller 185 maintains the carbon deposition rate at a selected point between 30 angstroms/minute and 300 angstroms/minute.

As a safeguard which assures that the temperature of the substrates 115 is maintained at about 75° C., the substrates are cooled by circulating a coolant such as water through the substrate fixture 110. For this purpose, the substrate fixture 110 has a hollow interior divided into an input cavity 110a and an output cavity 110b. Coolant is pumped down a hollow interior passage 125a in the center of the shaft 125 and returns through another hollow interior passage 125b in the shaft 125 concentrically surrounding the passage 125a.

A working example of the diamond-like carbon deposition process is as follows:

(1) Load clean substrates 115 onto the substrate fixture 110;
(2) Evacuate the chamber 100 to about $10^{-6}$ torr;
(3) Establish gas flow into chamber from the hydrogen gas supply 130;
(4) Set the pressure in the first chamber side 100a to $3 \times 10^{-3}$ torr;
(5) Apply power from the RF source at a power density between 0.2 to 1.0 watts/cm$^2$; and
(6) Evaporate carbon from the solid graphite source 106 with the electron beam source 104 at a deposition rate of between 30 and 300 angstroms/minute.

In this working example, the pressure sensor 160 was an MKS Baratron 390HA pressure transducer and the feedback control system 170 consisted of an MKS 270B signal conditioner connected to the output of the pressure sensor 160 and an MKS 252A exhaust valve controller connected to the output of the signal conditioner. The butterfly valve 155 was an MKS 253A variable orifice exhaust valve. All such MKS parts were purchased from MKS Instruments, Inc. in Andover, Mass. The controller 185 connected to the quartz crystal monitor 180 was an Inficon IC-6000 Deposition Controller purchased from Inficon Leibold Heraus, Inc. in Syracuse, N.Y. The electron beam power supply was an Eratron EB8-111 8kW unit (with sweep control) from Innotec Group Inc., Simi Valley, Calif. The electron beam source was a Temescal STIH-270-2MB electron beam gun from Airco Temescal, Berkeley, Calif.

While the invention has been described in detail by specific reference to preferred embodiments thereof, it is understood that variations and modifications may be made without departing from the true scope and spirit of the invention.

I claim:

1. A method of depositing a diamond-like carbon film onto the surface of a plastic substrate without melting the substrate and without accumulating a large repulsive charge around said substrate, comprising:
   directing an electron beam at a solid carbon source in a chamber so as to vaporize carbon from said solid carbon source while maintaining in the vicinity of said electron beam a first pressure;
   holding said substrate in a fixture in said chamber while applying a high frequency RF voltage to said fixture and while maintaining in the vicinity of said substrate a second pressure greater than said first pressure.

2. The method of claim 1 wherein said first pressure is sufficiently low to stabilize said electron beam and said second pressure is sufficiently high to enable said RF voltage to excite a plasma of ionized gas around said substrate.

3. The method of claim 1 further comprising:
   monitoring the rate at which carbon is deposited on said substrate; and
   controlling the current of said electron beam in response to said monitoring step.

4. The method of claim 1 further comprising rotating said substrate.

5. The method of claim 1 further comprising cooling said substrate so as to maintain its temperature below its melting temperature.

6. The method of claim 5 wherein said substrate is held in a rotating fixture in said chamber and wherein said cooling step comprises transporting a coolant through said fixture so as to remove heat therefrom.

7. The method of claim 1 wherein the melting temperature of said substrate is less than about 150° C.

8. The method of claim 7 wherein said melting temperature is on the order of about 100° C.

9. The method of claim 2 wherein said first pressure is less than about $10^{-4}$ torr and said second pressure is in the range of about $10^{-2}$ to $10^{-3}$ torr.

10. A method of depositing diamond-like carbon from a solid carbon source in a vacuum chamber onto the surface of an insulating substrate in said chamber without melting said substrate, said substrate having a melting temperature less than about 150° C., comprising:

directing an electron beam at said solid carbon source so as to vaporize carbon from said solid carbon source while maintaining in the vicinity of said electron beam a first pressure;

generating a high frequency RF electric field near said substrate while maintaining in the vicinity of said substrate a second pressure greater than said first pressure.

11. The method of claim 10 wherein said first pressure is sufficiently low to enable a stable trajectory for said electron beam and said second pressure is sufficiently high to enable said electric field to excite a plasma of ionized gas around said substrate.

12. The method of claim 11 wherein said first pressure is less than about $10^{-4}$ torr and said second pressure is in the range of about $10^{-2}$ to $10^{-3}$ torr.

13. The method of claim 10 further comprising introducing a gas into said chamber which tends to etch non-diamond-like carbon from the surface of said substrate.

14. The method of claim 10 wherein the step of generating said field comprises generating an RF signal from an RF source with a power density in excess of about 0.1 watts/cm$^2$, said signal having a frequency on the order of 10 MHz.

* * * * *